United States Patent
Seifert et al.

(10) Patent No.: US 7,031,349 B1
(45) Date of Patent: Apr. 18, 2006

(54) MULTIPLEXER CIRCUIT AND ANALOGUE-TO-DIGITAL CONVERTER

(75) Inventors: Martin Seifert, Alsdorf (DE); Christoph Gottschalk, Geilenkirchen (DE); Rüdiger Kohn, Übach-Palenberg (DE)

(73) Assignee: Mitsubishi Semiconductor Europe GmbH, Alsdorf (DE)

( * ) Notice: Subject to any disclaimer, the term of this patent is extended or adjusted under 35 U.S.C. 154(b) by 0 days.

(21) Appl. No.: 09/581,464

(22) PCT Filed: Oct. 7, 1999

(86) PCT No.: PCT/EP99/07531

§ 371 (c)(1),
(2), (4) Date: Aug. 4, 2000

(87) PCT Pub. No.: WO00/22730

PCT Pub. Date: Apr. 20, 2000

(30) Foreign Application Priority Data

Oct. 9, 1998 (EP) .................................. 98119148

(51) Int. Cl.
*H04J 3/02* (2006.01)
(52) U.S. Cl. .................................................... 370/537
(58) Field of Classification Search ................ 370/532, 370/535, 537, 540
See application file for complete search history.

(56) References Cited

U.S. PATENT DOCUMENTS 5,523,713 A * 6/1996 Yukutake et al. ........... 327/411
5,742,551 A * 4/1998 Yukutake et al. ........... 365/207
5,955,912 A * 9/1999 Ko .............................. 327/410

FOREIGN PATENT DOCUMENTS

GB    2 319 128 A    5/1998
JP    1-236731       9/1989

* cited by examiner

*Primary Examiner*—Chi Pham
*Assistant Examiner*—Anh-Vu Ly
(74) *Attorney, Agent, or Firm*—George W. Neuner; Edwards Angell Palmer & Dodge, LLP

(57) ABSTRACT

A multiplexer circuit (100) has at least two input channels ($IN_0$, $IN_1$) and an output channel (2). Each input channel ($IN_0$, $IN_1$) has a first transmission gate ($FT_0$, $FT_1$) and a second transmission gate ($ST_0$, $ST_1$). The transmission gate can be switched by a select signal ($SELECT_0$, $\overline{SELECT_0}$; $SELECT_1$, $\overline{SELECT_1}$) for connecting the input channel ($IN_0$, $IN_1$) to the output channel (2). At least one of the input channels ($IN_0$, $IN_1$) has a bypass circuit for preventing a current flowing through the first transmission gate ($FT_0$, $FT_1$) from reaching the other input channel.

18 Claims, 5 Drawing Sheets

MULTIPLEXER CIRCUIT AND ANALOGUE-TO-DIGITAL CONVERTER

BACKGROUND OF THE INVENTION

1. Field of the Invention

The invention relates to a multiplexer circuit according to the preamble of claim 1 and to an analogue-to-digital converter (ADC) comprising such a multiplexer circuit.

2. Description of the Related Art

In monolithic IC's transmission gates can be used for multiplexer circuits. They are suitable to select one of several analogue input channels to connect the selected channel, for example, to an ADC circuit on chip. Multiplexer circuits built with transmission gates implemented in monolithic IC's with MOS (metal oxide semiconductor) type circuits are known from CMOS Digital Integrated Circuits, Analysis and Design, S. M. Kang, Y. Leblebici, McGRAW-HILL INTERNATIONAL EDITIONS, ISBN 0-07-038046-5, page 274 and from Principles of CMOS VLSI Design, A System Perspective, second edition ADDISON WESLEY, N. H. E., Weste, K. Eshraghian, ISBN 0-201-53376-6, pages 17, 304.

An example of a conventional multiplexer circuit 1 comprising transmission gates is shown in FIG. 5. The multiplexer circuit 1 comprises at least two input channels $IN_0$, $IN_1$ which are connected with a common output channel 2. Of course, a plurality of input channels $IN_0$, $IN_1$, $IN_2$, ... $IN_i$ may be provided in the multiplexer circuit. For selecting one of said analogue input channels $IN_0$, $IN_1$ the multiplexer circuit comprises transmission gates $FT_0$, $FT_1$ between the input channel $IN_0$, $IN_1$ and the output channel 2, respectively. The multiplexer can select one of the two input channels $IN_0$, $IN_1$ by select signals $SELECT_0$, $\overline{SELECT_0}$, $SELECT_1$, $\overline{SELECT_1}$ generated by a decoder circuit 10. The decoder circuit generates a select signal $SELECT_0$, $SELECT_1$ and an inverted select signal $\overline{SELECT_0}$, $\overline{SELECT_1}$ for each input channel $IN_o$, $IN_1$, respectively, which are applied to the corresponding transmission gates $FT_0$, $FT_1$. The decoder circuit is a n to $2^n$ decoder ($i=2^n$), which ensures that only one of the select signals $SELECT_0$ to $SELECT_i$ becomes true while the others are false, i.e. only one channel is open while the others are closed. In the example according to FIG. 4 the channel $IN_1$ is selected i.e. the transmission gate $FT_1$ is open, whereas the channel $IN_0$ is not selected and the transmission gate $FT_0$ is closed. Analog voltages $U_1$, $U_2$ are applied to the input channels $IN_0$, $IN_1$, respectively. The voltage at the output channel 2 is indicated as $U_{out}$. The transmission gates $FT_0$, $FT_1$ are known CMOS transmission gates comprising p channel and n channel transistors having threshold voltages $V_{THp}$ and $V_{THn}$, respectively. The multiplexer circuit is operated with a power supply voltage $V_{cC}$ and $V_{ss}$ is the ground potential 0V.

The operation of the multiplexer circuit is as follows. In a normal operation condition the following input voltage conditions are applied:

$$U_1=[V_{ss}; V_{cc}]$$

$$U_2=[V_{ss}; V_{cc}]$$

That means the level of the input voltages $U_1$, $U_2$ is between the power supply voltage level $V_{cc}$ and $V_{ss}$.

Under these conditions the transmission gates $FT_0$ and $FT_1$ operate as ideal switches. Since the transmission gate $FT_0$ is closed, the voltage $U_{out}$ is equal to $U_2$:

$$U_{out}=U_2.$$

No current will flow in the multiplexer circuit, i.e. the current in the channels $IN_0$ and $IN_1$ is 0, respectively:

$$I_{in1}=0$$

$$I_{out}=0.$$

In case of an over or an under voltage applied to an input channel which is not selected i.e. which is not active a current will flow through the active channel. This is the under/over voltage operation condition. The following input voltage conditions are considered as under and over voltage conditions:

Under voltage:

$$-V_{THn}+V_{ss} \leq U_1 \leq V_{ss}.$$

Over voltage:

$$V_{cc} \leq U_1 \leq V_{cc}+|V_{THp}|,$$

The voltage $U_2$ is:
$$U_2=[V_{ss}; V_{cc}].$$

Under these conditions the transmission gate $FT_0$ in channel $IN_0$ does not work as an ideal switch any more. Due to "weak inversion" and the pn-diode structures of the CMOS transistors a current flows between $IN_0$ and $IN_1$.

$$|I_{in}| \leq 0$$

$$|I_{out}| \leq 0$$

$I_{out}$ creates a voltage drop at the resistance of the transmission gate $FT_1$ in channel $IN_1$ and the output resistance of the source of $U_2$. Therefore, $U_{out}$ is not equal to the input voltage $U_2$ any more. Depending on the desired accuracy of the analogue signal this will be a problem.

In particular for multiplexer circuits used in ADC's a noise at the injection source leads to worse accuracy, which makes the conversion results unusable (e.g. in case of an 8-bit ADC the absolute accuracy becomes 10–11 LSB instead of +/−2 LSB). External over/undervoltage protection circuits are required in order to be able to use such ADC's.

It is an object of the invention to provide a multiplexer circuit and an analogue-to-digital converter having an improved accuracy with respect to the output of an analogue input signal.

SUMMARY OF THE INVENTION

The present invention provides a multiplexer circuit comprising at least two input channels ($IN_0$, $IN_1$) and an output channel (2), each input channel ($IN_0$, $IN_1$) comprising a first transmission gate ($FT_0$, $FT_1$) which can be switched on by a select signal ($SELECT_0$, $\overline{SELECT_0}$; $SELECT_1$, $\overline{SELECT_1}$) for connecting the input channel ($IN_0$, $IN_1$) to the output channel (2), at least one of the input channels ($IN_0$, $IN_1$) comprising a by-pass circuit (20, 21; 50, 51; 60, 61; 80, 81; 90, 91; 160, 161; 170, 171) for preventing a current flowing through the first transmission gate ($FT_0$, $FT_1$) from reaching the other input channel, and a second transmission gate ($ST_0$, $ST_1$), characterized in that a control circuit is provided for controlling said bypass circuit.

Various embodiments of the present invention include one or more of the following:
a) a control circuit controls said bypass circuit dependent upon a voltage in the input channel ($IN_0$; $IN_j$);
b) a control circuit comprises a sense circuit (120, 130; 121, 131; 140, 150; 141, 151; 100, 110; 101, 111) to control said bypass circuit (80, 90; 81, 91; 160, 161; 170, 171) by sensing a voltage in the input channel (IN$_0$; IN$_1$);

c) each input channel (IN$_0$, IN$_1$) comprises a bypass circuit (20, 21; 50, 51; 60, 61; 80, 81; 90, 91; 160, 161; 170, 171) and a second transmission gate (ST$_0$, ST$_1$)

d) a bypass circuit (20, 21; 50, 51; 60, 61) is switched on for an input channel (IN$_0$) which is not selected and is switched off for a selected input channel (IN$_1$);

e) a bypass circuit comprises a pull-down circuit (20, 21; 50, 51; 80, 81; 160, 161) reducing an input voltage for the second transmission gate (ST$_0$, ST$_1$);

f) a bypass circuit (20, 21) is controlled by said select signal (SELECT$_0$, SELECT$_1$);

g) a bypass circuit (20, 21; 50, 51) is an NMOS transistor the gate of which is controlled by said select signal (SELECT$_0$, SELECT$_1$), the drain of which is connected with an output of said first transmission gate (FT$_0$, FT$_1$) and the source of which is connected with ground potential (V$_{ss}$);

h) a bypass circuit comprises a pull-up circuit (60, 61; 90, 91; 170, 171) increasing an input voltage for said second transmission gate (ST$_0$, ST$_1$);

i) a pull-up circuit (60, 61; 90, 91; 170, 171) is a PMOS transistor the drain of which is connected with an output of said first transmission gate (FT$_0$, FT$_1$) and the source of which is connected with a power supply voltage level (V$_{cc}$);

j) a control circuit controls said bypass circuit by means of said select signal (SELECT$_0$, SELECT$_0$; SELECT$_1$, SELECT$_1$) and an input voltage (U$_1$, U$_2$) applied to said input channel (IN$_0$, IN$_1$);

k) a control circuit controls said pull-up circuit (60, 61) and said pull-down circuit (50, 51) by means of said select signal (SELECT$_0$, SELECT$_0$; SELECT$_1$, SELECT$_1$) and an input voltage (U$_1$, U$_2$) applied to said input channel (IN$_0$, IN$_1$);

l) a control circuit comprises a NAND gate (110, 111) the output of which is connected with the gate of said PMOS transistor (90, 91) and a NOR gate (100, 101) the output of which is connected with the gate of said NMOS transistor (80, 81);

m) a NAND gate receives the input voltage and the inverted select signal (SELECT$_0$, SELECT$_1$) and said NOR gate receives the input voltage and the select signal (SELECT$_0$, SELECT$_1$);

n) a sense circuit (120, 130; 121, 131; 140, 150; 141 151) is formed so as to sense a voltage in the input channel (IN$_0$, IN$_1$) at the input of said first transmission gate (FT$_0$, FT$_1$) or between said first transmission gate (FT$_0$, FT$_1$) and said second transmission gate (ST$_0$, ST$_1$);

o) a pull-down bypass circuit is formed of a NMOS transistor (160; 161) the drain of which is connected with an output (70, 71) of said first transmission gate (FT$_0$, FT$_1$) and the source of which is connected with the ground level (V$_{ss}$) and wherein said sense circuit is formed of a PMOS transistor (130; 131) and an NMOS transistor (120; 121) in series the source of the NMOS transistor (120; 121) being connected to ground level (V$_{ss}$) and the source of PMOS transistor (130; 131) being connected to an output (70, 71) of said first transmission gate (FT0, FT1) and wherein the drains of said PMOS transistor (130; 131) and said NMOS transistor (120; 121) are connected to each other and to the gate of the NMOS bypass transistor (160; 161); and p) a pull up bypass circuit is formed of a PMOS transistor (170; 171) the drain of which is connected with an output (70; 71) of said first transmission gate (FT$_0$, FT$_1$) and the source of which is connected with power supply voltage level (v$_{cc}$) and wherein said sense circuit is formed of a PMOS transistor (150; 151) and an NMOS transistor (140; 141) in series the source of the PMOS transistor (150; 151) being connected to power supply voltage level (V$_{cc}$) and the source of the NMOS transistor (140; 141) being connected to an output (70; 71) of said first transmission gate (FT$_0$, FT$_1$) and wherein the drains of the PMOS transistor (150; 151) and the NMOS transistor (140; 141) are connected to each other and to the gate of the PMOS bypass transistor (170, 171).

The invention also provides an analogue-to-digital converter comprising a multiplexer circuit as set forth herein.

Embodiments of the invention will be explained with reference to the accompanying drawings.

DETAILED DESCRIPTION OF THE INVENTION

Figure 1:
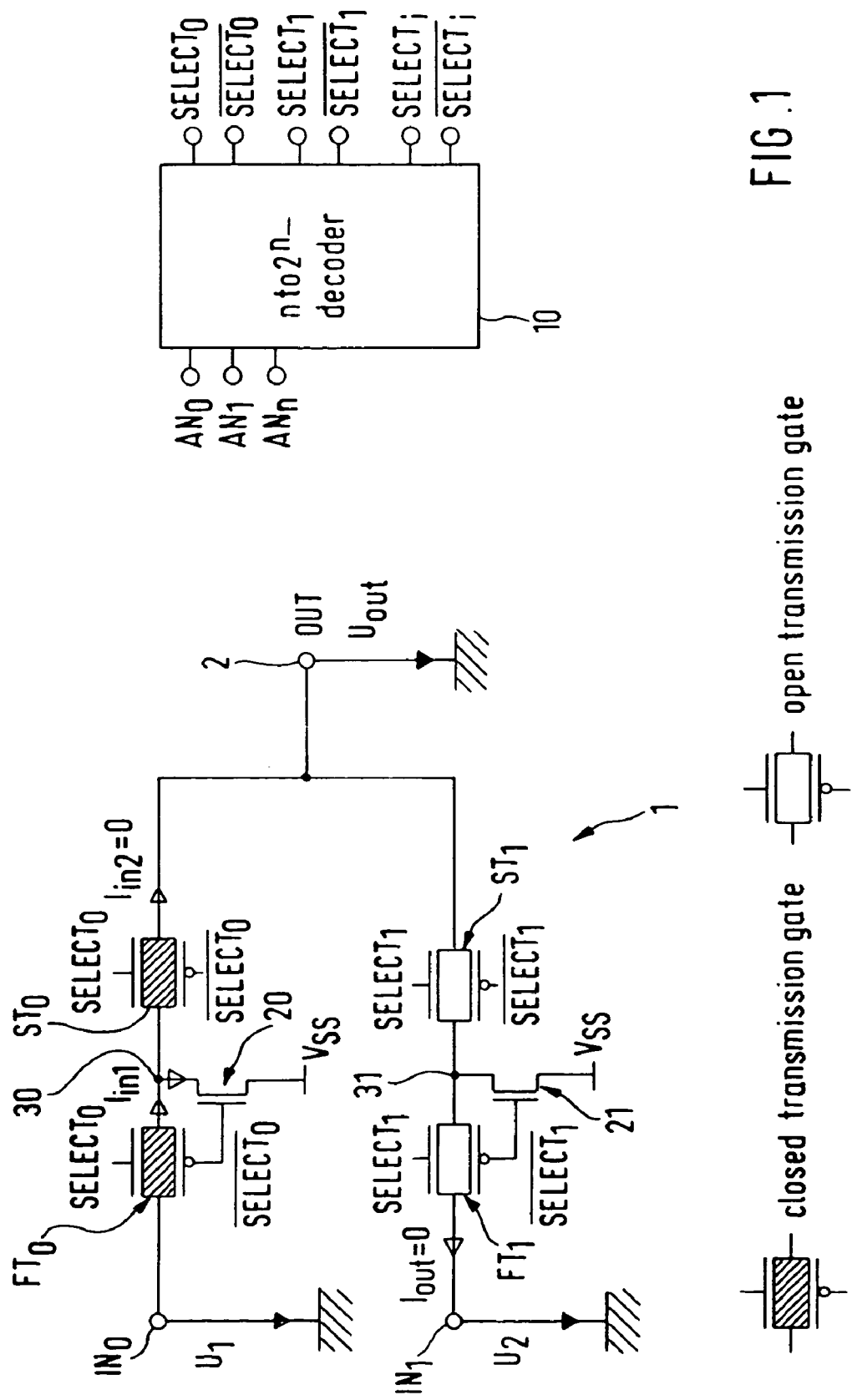
FIG. 1 shows a multiplexer circuit according to a first embodiment of the invention.
Figure 4:
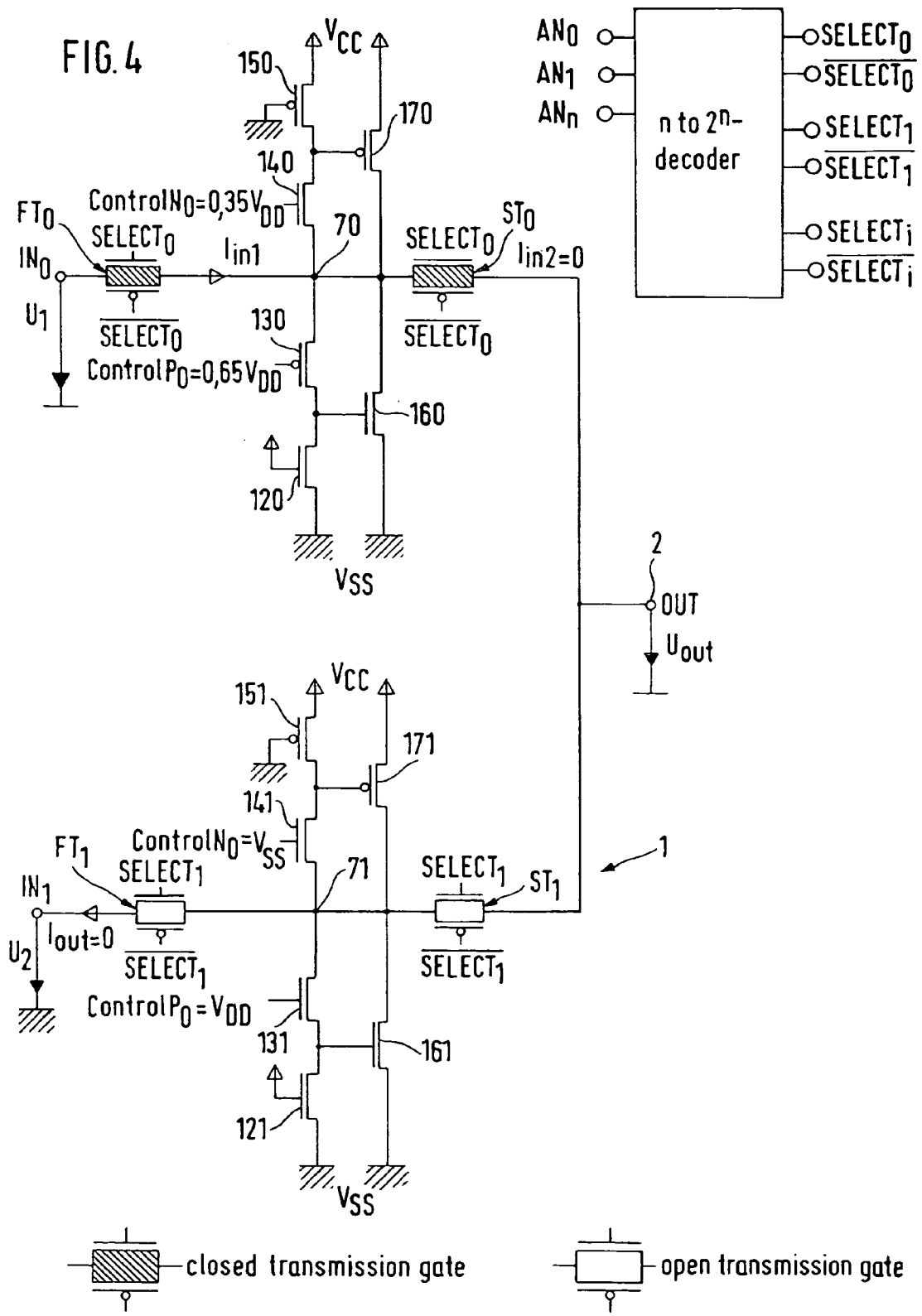
FIG. 4 shows a multiplexer circuit according to a further embodiment of the multiplexer circuit of FIG. 2.
Figure 5:
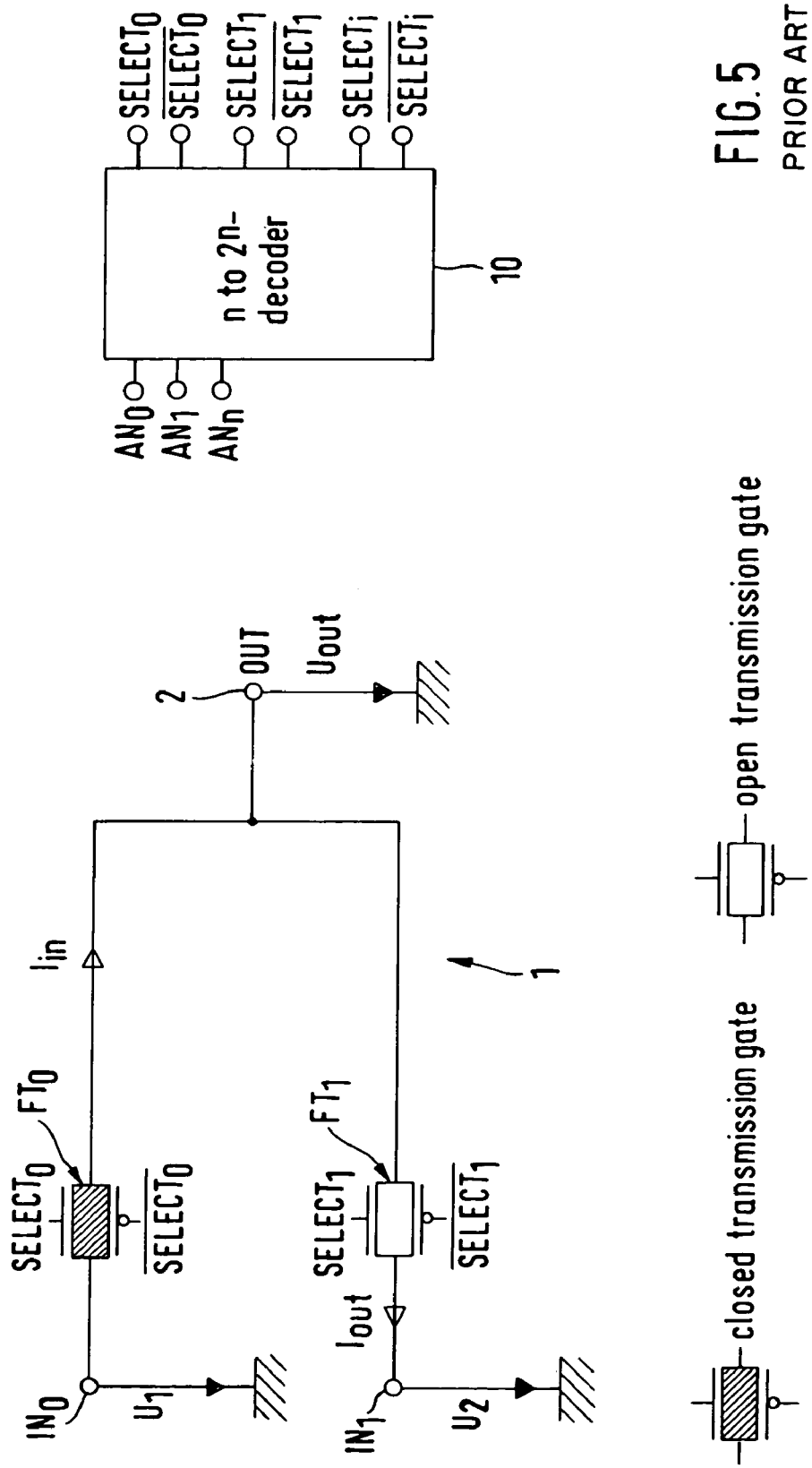
FIG. 5 shows an example of a conventional multiplexer circuit.

A first embodiment of the multiplexer circuit according to the invention is shown in FIG. 1. Parts which are the same as in the conventional multiplexer circuit according to FIG. 4 are designated with the same reference signs and the description thereof will not be repeated.

The multiplexer circuit according to this embodiment comprises a first transmission gate FT$_0$, FT$_1$, for each channel respectively, and a second transmission gate ST$_0$, ST$_1$ for each channel. The output of the first transmission gate FT$_0$, FT$_1$ in each channel is connected with the input of the second transmission gates ST$_0$, ST$_1$, respectively. The output of the second transmission gate ST$_0$ and ST$_1$ is connected with the output channel 2. The second transmission gate ST$_0$, ST$_1$ are controlled by the same select signals SELECT$_0$, SELECT$_0$ and SELECT$_1$, SELECT$_1$ as the first transmission gates FT$_0$, FT$_1$.

A bypass circuit in form of an NMOS transistor 20, 21 is provided for each analogue input channel IN$_0$, IN$_1$. Each NMOS transistor 20, 21 is connected with its drain to a node 30 31. Each node 30, 31 is connected with the output of the first transmission gate FT$_0$, FT$_1$ and the input of the second transmission gate ST$_0$, ST$_1$, respectively. The source of each NMOS transistor 20, 21 is connected with the ground potential level V$_{ss}$. The gate of each NMOS transistor receives the inverted select signal SELECT$_0$, SELECT$_1$, respectively, which is generated by the channel decoder 10. In this embodiment the NMOS transistors are controlled by the same select signal as the PMOS transistor of the transmission gates.

In the example according to FIG. 1 the channel IN$_1$ is selected and the first transmission gate FT$_1$, and the second transmission gate ST$_1$ are both open. Since the NMOS transistor 21 receives the inverted select signal SELECT$_1$ on its gate, the NMOS transistor 21 is switched off for the selected channel $IN_1$. The channel $IN_0$ is not selected and therefore, the first transmission gate $FT_0$ and the second transmission gate $ST_0$ are both closed. Since the NMOS transistor 20 receives the inverted select signal $SELECT_0$ on its gate, the NMOS transistor 20 is switched on for the not selected channel $IN_0$.

In operation the select signals are applied to the transmission gates such that the input channel $IN_1$ is selected by opening the first transmission gate $FT_1$' and the second transmission gate $ST_1$ by the select signal $SELECT_1$ ($SELECT_1=1$). The other input channel $IN_0$ is not selected by closing the first transmission gate $FT_0$ and the second transmission gate $ST_0$ by applying the select signal $SELECT_0$ ($SELECT_0=0$).

In case the voltage $U_1$ applied to the first input channel $IN_0$ has an over voltage i.e.

$$V_{cc} \leq U_1 \leq V_{cc}+|V_{THp}|,$$

a current $I_{in1}$ flows through the first transmission gate $FT_0$ to node 30. Since the NMOS transistor 20 is switched on by the select signal $SELECT_0$, the current $I_{in1}$ is bypassed through the NMOS transistor 20 to ground. The potential at node 30 is (due to being pulled down by NMOS transistor 20) in the range of $[0, V_{cc}]$. Therefore, the transmission gate $ST_0$ operates as an ideal switch, i.e. closes perfectly. Therefore, the selected input channel $IN_1$ is not influenced by the over voltage on the first input channel $IN_0$. The output voltage $U_{out}$ is equal to $U_2$.

Without changing the circuit in FIG. 1 the NMOS transistor 20 pulls an undervoltage $-V_{TH,N}<U_1<_0$ at the input to a potential in the range of $[-V_{TH,N}, 0]$ at node 30. This is enough to switch the transmission gate $ST_1$ off and to avoid influence to the analogue input. Hence, the NMOS transistor is a measure against under voltage. However, the bypass behaviour of the NMOS transistor for over voltage condition is better than for under voltage condition.

Figure 2:
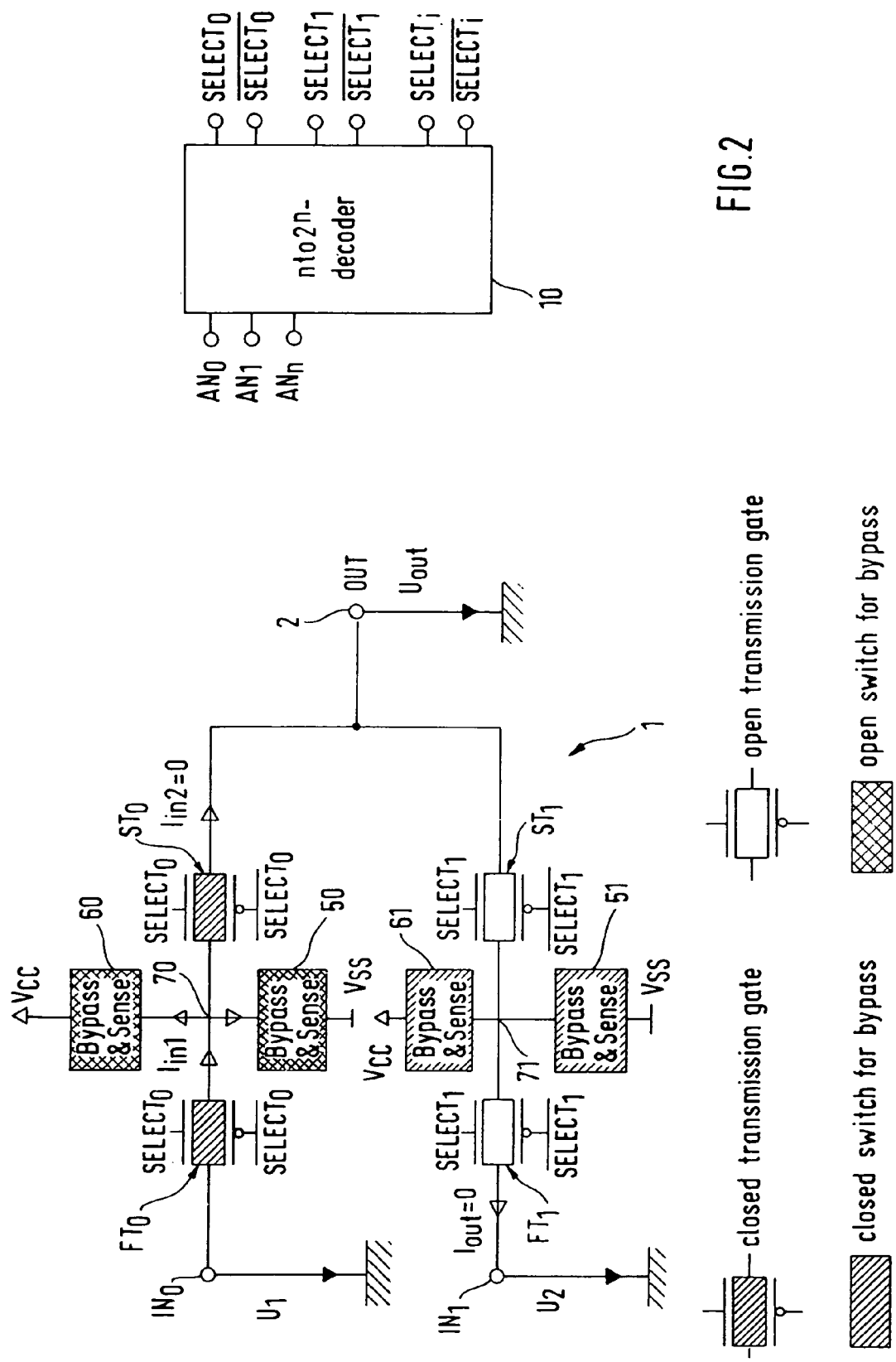
FIG. 2 shows a multiplexer circuit according to a second embodiment of the invention.

FIG. 2 shows an embodiment of a multiplexer circuit in order to bypass the current for over or under voltage conditions. In the embodiment according to FIG. 2 parts which are equal to parts of the embodiment according to FIG. 1 are described with the same reference signs. The multiplexer circuit according to FIG. 2 comprises a pull-down bypass circuit 50, 51 in each channel $IN_0$, $IN_1$ and in addition a pull-up bypass circuit 60, 61. The pull-down bypass circuit 50, 51 is connected between a node 70, 71 and $V_{ss}$ level and the pull-up bypass circuit 60, 61 is connected between the node 70, 71 and $V_{cc}$ level, respectively.

The multiplexer circuit according to FIG. 2 also comprises two operation conditions: In the normal operation condition the following input voltage conditions are applied:

$$U1=[V_{ss}; V_{CC}]$$

$$U2=[V_{ss}; V_{cc}].$$

Under these conditions the transmission gates operate as ideal switches. The voltage $U_{out}$ is equal to $U_2$. No current will flow:

$$I_{in1}=0$$

$$I_{out}=0.$$

In an under/over voltage operation condition the following input voltage conditions are considered as under and over voltage conditions:

Under voltage:

$$-V_{TH}n+V_{ss} \leq U_1 \leq V_{ss}$$

Over voltage:

$$V_{cc} \leq U_1 \leq V_{cc}+|V_{THp}|$$

($V_{THn}$, $V_{TH}p$ are threshold voltages of p- and n channel transistors)

The voltage $U_2$ is:
$$U_2=[V_{ss}; V_{cc}].$$

Under these conditions the first transmission gate $FT_0$ in channel $IN_0$ does not work as an ideal switch. The current is bypassed to $V_{ss}$ level or $V_{cc}$ level by using the bypass circuit 50 or 60. The second transmission gate $ST_0$ is implemented in order not to change the $U_{out}$ voltage. In case of an over/under voltage condition the bypass circuit 50 reduces the input voltage for the second transmission gate $ST_0$, so that no over voltage condition occurs at the second transmission gate $ST_0$ and the bypass circuit 60 increases the input voltage for the second transmission gate, so that no under voltage condition occurs at the second transmission gate $ST_0$. Therefore, the second transmission gate will work again as an ideal switch. As a result no current flows between $IN_0$ and $IN_1$ and the voltage $U_{out}$ is equal to the input voltage $U_2$, i.e.

$$|I_{in1}| \geq 0$$

$$|I_{in2}|=0$$

$$|I_{out}|=0$$

$$0_{out}=U_2.$$

An additional circuit senses either the voltage in front of $FT_0$ or between $FT_0$ and $ST_0$ and switches on either the bypass circuit to $V_{cc}$ in case of under voltage or the bypass circuit to $V_{ss}$ in case of over voltage. This is necessary to avoid a shortcut between $V_{cc}$ and $V_{ss}$ via the two bypass circuits. The combination of the bypass circuit and the sense circuit forms a bypass and sense circuit.

Figure 3:
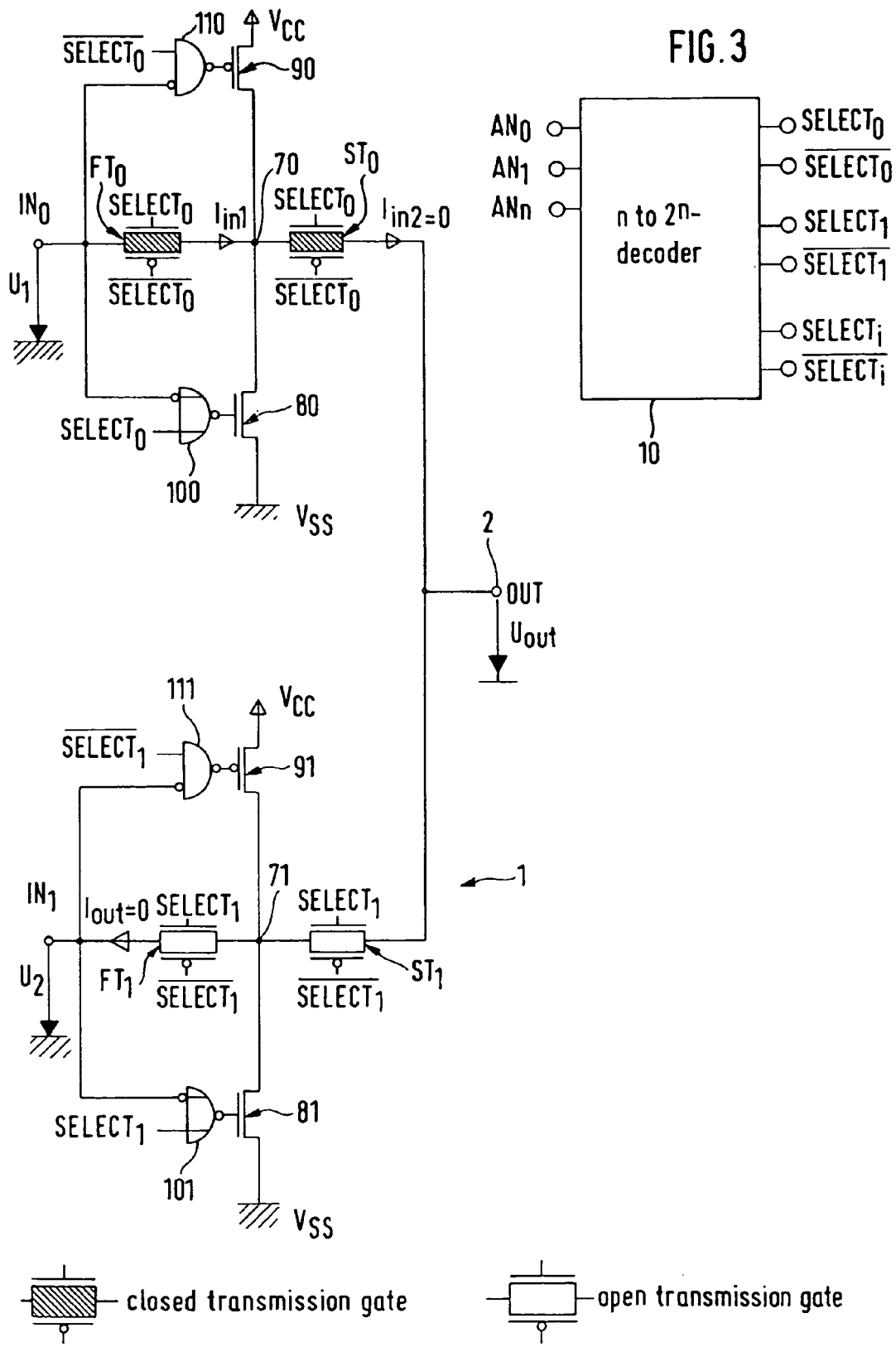
FIG. 3 shows a multiplexer circuit according to the second embodiment of the invention more in detail.

In a further development the bypass and sense circuit contains elements to control the potential between $FT_0$ and $ST_0$. FIG. 3 shows a specific embodiment of the multiplexer circuit according to FIG. 2. For each channel the pull-down bypass circuit 50 is realized with an NMOS transistor 80, 81 and the pull-up bypass circuit is realized with a PMOS transistor 90, 91, respectively. The NMOS transistor will be used as over voltage protection and the PMOS transistor will be used as under voltage protection on channels that are not selected.

A control circuit for the bypass circuits comprises NOR gates 100, 101, the output of which is connected with the gate of the NMOS transistor 80, 81, respectively. The control circuit further comprises NAND gates 110, 111, the output of which is connected with the gate of the PMOS transistor 90, 91, respectively. One input of the NOR gate 100, 101 is connected with the input voltage $U_1$, $U_2$, respectively, and the other input of the NOR gate 100, 101 is connected with the select signal $SELECT_0$, $SELECT_1$. One input of the NAND gate 110, 111 is connected with the input voltage $U_1$, $U_2$, respectively, and the other input of the NAND gate 110, 111 is connected with the inverted select signal $SELECT_0$, $SELECT_1$. Therefore, the input signals of the control circuit are the input voltage $U_1$, $U_2$ and the select and the inverted select signals which control the transmission gates. If a channel is not selected (SELECT=0) and an under voltage condition occurs ($U_1<0$ V) the PMOS transistor 90 will be switched on. If a channel is not selected (SELECT=0) and an over voltage condition occurs ($U_1>5$ V), the NMOS transistor 80 will be switched on.

FIG. 4 shows a second specific embodiment of the multiplexer circuit according to FIG. 2. A control circuit for controlling the bypass circuit comprises a sense circuit for sensing a voltage in the input channel. The sense circuit and the bypass circuit in combination form a bypass and sense circuit consisting of a sense path and a bypass path. In the bypass and sense circuit to $V_{ss}$ the sense path comprises a PMOS transistor 130, 131 in series with an NMOS transistor 120, 121. The source of the PMOS transistor 130, 131 is connected to said first transmission gate $FT_0$, $FT_1$ and the source of the NMOS transistor 120, 121 is connected to ground level $V_{ss}$. The drain of the PMOS transistor 130, 131 is connected with the drain of the NMOS transistor 120, 121. The bypass path is formed of NMOS transistor 160, 161 the drain of which is connected with the output of said first transmission gate $FT_0$, $FT_1$ and the source of which is connected with VS. The gate of NMOS transistor 160, 161 is connected with the drains of the PMOS and NMOS transistors of the sense circuit. The driveability of NMOS transistor 120, 121 is very weak compared to the driveability of PMOS transistor 130, 131. For a channel that is switched off a voltage of $0.65\ V_{DD}$ is applied to gate of PMOS 130, 131. Both the sense path and the bypass path are switched off as long as the potential at node 70, 71 fulfils the condition $U70<0.65V_{DD}+|V_{THp}|$. When due to an over voltage at the input the voltage at node 70, 71 exceeds $U70>0.65V_{DD}+|V_{THp}|$ the sense path drives a small current to $V_{ss}$. Because of the big impedance of NMOS 120, 121 compared to the impedance of PMOS 130, 131 the gate voltage at the gate of bypass transistor NMOS 160, 161 increases very quickly so that this transistor changes very quickly to the conducting state. In this way a low impedance path to $V_{ss}$ is installed when the voltage U70 is close to $V_{DD}$. The bypass and sense circuit to $V_{ss}$ can be associated with an ideal switch that switches on as soon as U70 approximates $V_{DD}$.

The pull-up bypass and sense circuit consists of NMOS 140, 141 and PMOS 150, 151 as sense path and PMOS 170, 171 as bypass path. In the bypass path, the drain of PMOS transistor 170, 171 is connected with the output 70, 71 of said first transmission gate $FT_0$, $FT_1$ and the source is connected with power supply voltage level $V_{cc}$. In the sense path the source of the PMOS transistor 150, 151 is connected to power supply voltage level $V_{cc}$ and the source of the NMOS transistor 140, 141 is connected to an output 70, 71 of said first transmission gate $FT_0$, $FT_1$, and the drains of the PMOS transistor 150, 151 and the NMOS transistor 140, 141 are connected to each other. The gate of the PMOS transistor 170, 171 is connected with the drains of the PMOS and NMOS transistors of the sense path. The bypass and sense circuit works in an analogue way for undervoltage.

Measurements on real chips prove that a subthreshold current via closed $FT_0$ can occur also for valid input voltages $V_{SS}<U1<V_{DD}$ dependent on the voltage drop between drain and source of $FT_0$. If this voltage drop is significant leakage is likely to occur due to the fact that the $V_{DD}$ level in the chip (and at the gate of $FT_0$) is a little bit less than the $V_{DD}$ level applied from externally and due to the big width of $FT_0$, which is necessary to achieve a small impedance if the input is active ADC input channel. The proposed bypass and sense circuits keep the voltage drop on $FT_0$ as small as possible and thus limit the subthreshold current into the pad. The reason is that both bypass and sense circuits are switched off for potentials U70 in the range $0.35V_{DD}-V_{THn}<U70<0.65V_{DD}+|V_{THp}|$, i.e. currents via $FT_0$ can only flow if one of the conditions $U70>0.65V_{DD}+|V_{THp}|$ or $U70<0.35V_{DD}-V_{THn}$ is fulfilled.

A small pad input leakage current is an important quality criteria for the IO circuit of an integrated circuit.

Of course, each of the embodiments according to FIGS. 1 to 4 may comprise not only two but a plurality of input channels and each channel may have the pull-up and/or pull-down circuits and the second transmission gates as described above.

An ADC circuit according to the invention comprises a multiplexer circuit according to the embodiments of FIGS. 1 to 4 where the output voltage $U_{OUT}$ of the multiplexer is the input voltage for the ADC. The accuracy of such an ADC can be as good as without over/undervoltage, i.e. the over/undervoltage has no influence to the conversion result (e.g. in case of an 8-bit ADC the accuracy is +/−2 LSB with or without over/undervoltage).

What is claimed is:

1. A multiplexer circuit comprising at least two input channels and an output channel, each input channel comprising a first transmission gate which can be switched on by a select signal for connecting the input channel to the output channel, at least one of the input channels comprising a bypass circuit for preventing a current flowing through the first transmission gate from reaching the other input channel, and a second transmission gate, said multiplexer circuit further comprising a control circuit for controlling said bypass circuit, wherein said bypass circuit is adapted to be switched on and off, and said control circuit senses a value of a voltage in the input channel and switches said bypass circuit dependent upon the value of said voltage in the input channel compared to a predetermined range of values, wherein, said control circuit controls said bypass circuit by means of said select signal and an input voltage applied to said input channel.

2. The multiplexer circuit according to claim 1, wherein said control circuit comprises a sense circuit to control said bypass circuit by sensing a voltage in the input channel.

3. The multiplexer circuit according to claim 2, wherein said sense circuit is constructed and adapted to sense a voltage in the input channel at the input of said first transmission gate or between said first transmission gate and said second transmission gate.

4. A multiplexer circuit according to claim 3, wherein a pull-down bypass circuit is formed of a first NMOS transistor having a drain and a source, the drain of which is connected with an output of said first transmission gate and the source of which is connected with the ground level, and wherein said sense circuit is formed of a PMOS transistor and a second NMOS transistor in series, the second NMOS transistor having a source and a drain, the source of the second NMOS transistor being connected to ground level and the PMOS transistor having a source and a drain, the source being connected to an output of said first transmission gate, and wherein the drains of said PMOS transistor and said second NMOS transistor are connected to each other and to the gate of the first NMOS transistor in the bypass circuit.

5. The multiplexer circuit according to claim 3, wherein said pull up bypass circuit is formed of a first PMOS transistor having a drain and a source, the drain of which is connected with an output of said first transmission gate and the source of which is connected with power supply voltage level, and wherein said sense circuit is formed of a second PMOS transistor and an NMOS transistor in series, the second PMOS transistor and the NMOS transistor each having a source and a drain, the source of the second PMOS transistor being connected to power supply voltage level and the source of the NMOS transistor being connected to an output of said first transmission gate, and wherein the drains of the second PMOS transistor and the NMOS transistor are connected to each other and to the gate of the first PMOS transistor in the bypass circuit.

6. The multiplexer circuit according to claim 1, wherein each input channel comprises a bypass circuit and a second transmission gate.

7. The multiplexer circuit according to claim 6, wherein the bypass circuit is switched on for an input channel which is not selected and is switched off for a selected input channel.

8. The multiplexer circuit according to claim 1, wherein said bypass circuit comprises a pull-down circuit reducing an input voltage for the second transmission gate.

9. The multiplexer circuit according to claim 1, wherein said bypass circuit is controlled by said select signal.

10. The multiplexer circuit according to claim 1, wherein said bypass circuit is an NMOS transistor comprising a gate, a drain and a source, the gate of which is controlled by said select signal, the drain of which is connected with an output of said first transmission gate and the source of which is connected with ground potential.

11. The multiplexer circuit according to claim 1, wherein said bypass circuit comprises a pull-up circuit increasing an input voltage for said second transmission gate.

12. The multiplexer circuit according to claim 11, wherein said pull-up circuit is a PMOS transistor comprising a drain and a source, the drain of which is connected with an output of said first transmission gate and the source of which is connected with a power supply voltage level.

13. The multiplexer circuit according to claim 1, wherein said bypass circuit comprises a pull-down circuit reducing an input voltage for the second transmission gate and a pull-up circuit increasing an input voltage for said second transmission gate, wherein said control circuit controls said pull-up circuit and said pull-down circuit by means of said select signal and an input voltage applied to said input channel.

14. The multiplexer circuit according to claim 13, wherein said bypass circuit comprises (a) an NMOS transistor comprising a gate, a drain and a source, the gate of which is controlled by said select signal, the drain of which is connected with an output of said first transmission gate and the source of which is connected with ground potential and (b) a PMOS transistor comprising a drain and a source, the drain of which is connected with an output of said first transmission gate and the source of which is connected with a power supply voltage level, wherein said control circuit comprises a NAND gate the output of which is connected with the gate of said PMOS transistor and a NOR gate the output of which is connected with the gate of said NMOS transistor.

15. The multiplexer circuit according to claim 14, wherein said NAND gate receives the input voltage and the inverter select signal and said NOR gate receives the input voltage and the select signal.

16. An analogue-to-digital converter comprising a multiplexer circuit according to claim 1.

17. A multiplexer circuit comprising at least two input channels and an output channel, each input channel comprising a first transmission gate which can be switched on by a select signal for connecting the input channel to the output channel, at least one of the input channels comprising a by-pass circuit for preventing a current flowing through the first transmission gate from reaching the other input channel, and a second transmission gate, said multiplexer circuit further comprising a control circuit for controlling said bypass circuit, wherein said control circuit comprises a sense circuit to control said bypass circuit by sensing a voltage in the input channel, and wherein said sense circuit is constructed and adapted to sense a voltage in the input channel at the input of said first transmission gate or between said first transmission gate and said second transmission gate, and wherein a pull-down bypass circuit is formed of a first NMOS transistor having a drain and a source, the drain of which is connected with an output of said first transmission gate and the source of which is connected with the ground level, and wherein said sense circuit is formed of a PMOS transistor and a second NMOS transistor in series, the second NMOS transistor having a source and a drain, the source of the second NMOS transistor being connected to ground level and the PMOS transistor having a source and a drain, the source being connected to an output of said first transmission gate, and wherein the drains of said PMOS transistor and said second NMOS transistor are connected to each other and to the gate of the first NMOS transistor in the bypass circuit.

18. A multiplexer circuit comprising at least two input channels and an output channel, each input channel comprising a first transmission gate which can be switched on by a select signal for connecting the input channel to the output channel, at least one of the input channels comprising a by-pass circuit for preventing a current flowing through the first transmission gate from reaching the other input channel, and a second transmission gate, said multiplexer circuit further comprising a control circuit for controlling said bypass circuit, wherein said control circuit comprises a sense circuit to control said bypass circuit by sensing a voltage in the input channel, and wherein said sense circuit is constructed and adapted to sense a voltage in the input channel at the input of said first transmission gate or between said first transmission gate and said second transmission gate, and wherein a pull-up bypass circuit is formed of a first PMOS transistor having a drain and a source, the drain of which is connected with an output of said first transmission gate and the source of which is connected with power supply voltage level, and wherein said sense circuit is formed of a second PMOS transistor and an NMOS transistor in series, the second PMOS transistor and the NMOS transistor each having a source and a drain, the source of the second PMOS transistor being connected to power supply voltage level and the source of the NMOS transistor being connected to an output of said first transmission gate, and wherein the drains of the second PMOS transistor and the NMOS transistor are connected to each other and to the gate of the first PMOS transistor in the bypass circuit.

* * * * *